(12) United States Patent
Yu et al.

(10) Patent No.: US 6,221,724 B1
(45) Date of Patent: Apr. 24, 2001

(54) METHOD OF FABRICATING AN INTEGRATED CIRCUIT HAVING PUNCH-THROUGH SUPPRESSION

(75) Inventors: Bin Yu; Shekhar Pramanick, both of Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/187,252

(22) Filed: Nov. 6, 1998

(51) Int. Cl.$^7$ .................................................. H01L 21/336
(52) U.S. Cl. ........................ 438/289; 438/301; 438/299; 438/290; 438/305; 438/407; 438/528
(58) Field of Search .................................... 438/301, 528, 438/305, 289, 290, 407

(56) References Cited

U.S. PATENT DOCUMENTS

| | | | |
|---|---|---|---|
| 4,717,683 | | 1/1988 | Parrillo et al. ......................... 437/34 |
| 5,217,910 | * | 6/1993 | Shimizu et al. . |
| 5,378,650 | * | 1/1995 | Kimura . |
| 5,413,949 | * | 5/1995 | Hong . |
| 5,416,033 | | 5/1995 | Lee et al. ............................... 437/41 |
| 5,548,143 | * | 8/1996 | Lee . |
| 5,618,740 | | 4/1997 | Huang ................................... 438/224 |
| 5,658,811 | | 8/1997 | Kimura et al. ........................ 438/289 |
| 5,674,760 | * | 10/1997 | Hong . |
| 5,753,556 | | 5/1998 | Katada et al. ......................... 438/302 |
| 5,780,328 | | 7/1998 | Fukuda et al. ........................ 438/201 |
| 5,792,699 | * | 8/1998 | Tsui . |
| 5,856,225 | * | 1/1999 | Lee et al. . |
| 5,893,740 | * | 4/1999 | Chang et al. . |
| 5,895,954 | * | 8/1999 | Yaumura et al. . |
| 5,930,642 | * | 7/1999 | Moore et al. . |
| 5,986,314 | * | 11/1999 | Seshadri et al. . |
| 6,005,285 | * | 12/1999 | Gardner et al. . |
| 6,017,808 | * | 1/2000 | Wang et al. . |
| 6,025,238 | * | 2/2000 | Gardner et al. . |
| 6,027,978 | * | 2/2000 | Gardner et al. . |

\* cited by examiner

*Primary Examiner*—John F. Niebling
*Assistant Examiner*—Jonathan Hack
(74) *Attorney, Agent, or Firm*—Foley & Lardner

(57) ABSTRACT

An integrated circuit and method of fabrication is provided for an integrated circuit having punch-through suppression. Unlike conventional methods of punch-through suppression wherein a dopant implant is fabricated in the device, the present invention utilizes an inert ion implantation process whereby inert ions are implanted through a fabricated gate structure on the semiconductor substrate to form a region of inert ion implant between source and drain regions of a device on the integrated circuit. This accumulation region prevents punch-through between source and drain regions of the device. In a second embodiment, the inert ion implantation is used in conjunction with the conventional punch-through dopant implant. In this second embodiment, diffusion of the implant during subsequent thermal annealing is suppressed by the inert ion accumulation in the subsurface region of the device. Accordingly, improved integrated circuits and methods of fabricating an integrated circuit having punch-through suppression are disclosed.

20 Claims, 2 Drawing Sheets

METHOD OF FABRICATING AN INTEGRATED CIRCUIT HAVING PUNCH-THROUGH SUPPRESSION

FIELD OF THE INVENTION

The present invention relates generally to a method of fabricating an integrated circuit and more specifically to a method of fabricating an integrated circuit having punch-through suppression.

BACKGROUND OF THE INVENTION

In very large-scale integrated circuits (VLSI), and even more so in ultra large-scale integrated (ULSI) circuits, the channel length of transistors, such as metal oxide semiconductor field effect transistors (MOSFETs) must be minimized. This allows a greater number of transistors to be fabricated on a single substrate and also provides for a faster transistor switching speed due to the shorter transit time of carriers moving between the source and the drain regions. One of the major difficulties with reducing the channel length is punch-through, in which the depletion layers from the source and drain regions contact one another, causing the potential barrier between the source and the drain to decrease. Punch-through results in significant leakage current, even when the transistor is in the off state.

The punch-through voltage (Vpt) of a device is defined as the drain-to-source voltage (Vds) at which the current from drain to source (Ids) reaches an unacceptable value with a gate-to-source voltage (Vgs) of zero. Punch-through must be suppressed in a device to the point where Vpt is larger than any possible Vds. One method for suppressing Vpt is to increase doping of the drain and source regions to decrease the depletion layer widths. Typically, this increased doping is used along with a threshold voltage adjust (Vt-adjust) implant. A Vt-adjust implant is a region of increased doping, e.g. boron in N-channel MOSFETs, phosphorous in P-channel MOSFETs. Other dopants for the Vt-adjust implant can include indium and boron difluoride ($BF_2$). The Vt-adjust implant is typically implanted beneath the surface channel region to raise the dopant concentration beneath the surface channel region above the dopant concentration of the substrate. However, during the subsequent thermal annealing process, the dopant from this Vt-adjust implant may diffuse toward the surface and raise the dopant concentration in the channel, causing carrier mobility degradation due to increased impurity scattering.

Another method for suppressing Vpt is using "halo" implants. P-type dopants (in N-channel MOSFETs) are implanted under the lightly doped drain/source extensions (e.g., tip regions of the drain and source regions.) The implanted dopant raises the doping concentration only on the walls of the source and drain regions near the surface channel region. Thus, the channel length can be decreased without needing to use a substrate doped to a higher concentration. However, "halo" implants must be fabricated with great precision and may also result in an increase in the sidewall junction capacitance.

Accordingly, there is a need for an improved method of suppressing punch-through in an integrated circuit (IC). Further, there is a need for a method which allows for greater density of devices on the integrated circuit and improved efficiency of the IC. Even further still, there is a need for a punch-through suppression process which is easier to perform than prior punch-through suppression methods.

SUMMARY OF THE INVENTION

These and other limitations of the prior art are addressed by the present invention which is directed to a method of fabricating an integrated circuit having punch-through suppression between two regions of a device. According to one embodiment of the present invention, the device includes a channel region between the two regions. The method includes providing a semiconductor substrate; forming a gate on the substrate near the channel region; and implanting an implant material through the gate. The implant material accumulates below the channel region to provide punch-through suppression between the two regions of the device.

According to another feature of the present invention, the implant material includes inert ions and is also implanted through two regions of the device so that the inert ions form second and third accumulations below the surface of the two regions of the device.

According to another advantageous feature of the present invention, the substrate has a level of transient enhanced diffusion (TED) associated therewith and the inert ions operate to substantially neutralize the TED in the substrate.

According to yet another advantageous feature of the present invention, diffusion of dopant from the gate into the channel region of the substrate is suppressed by the implant material.

According to a second exemplary embodiment of the present invention, a method of fabricating an integrated circuit is provided, the integrated circuit having punch-through suppression between two regions of a device. In this second exemplary embodiment, the device includes a channel region between the two regions. The method includes providing a semiconductor substrate; implanting a punch-through dopant between the two regions of the device to form a punch-through dopant implant; forming a gate on the substrate near the channel region; and implanting an implant material through the gate so that the implant material accumulates beneath the channel region. This second exemplary embodiment provides suppression of punch-through between the two regions of the device and further suppresses diffusion of the punch-through dopant implant toward the channel region.

According to yet a third exemplary embodiment of the present invention, a method of fabricating an integrated circuit having electrical isolation between two regions of the integrated circuit is provided. The method includes providing a semiconductor substrate; forming a conductive structure on the substrate at a selected location; and implanting inert ions through the conductive structure and through the two regions of the device. The inert ions form a first accumulation below the selected location and second and third accumulations below the two regions of the device. The accumulations of inert ions provide electrical isolation of the two regions of the device.

BRIEF DESCRIPTION OF THE DRAWINGS

The present invention will be described with reference to the accompanying drawings, wherein like numerals denote like elements, and.

DETAILED DESCRIPTION OF THE PREFERRED EMBODIMENTS

Figure 1:
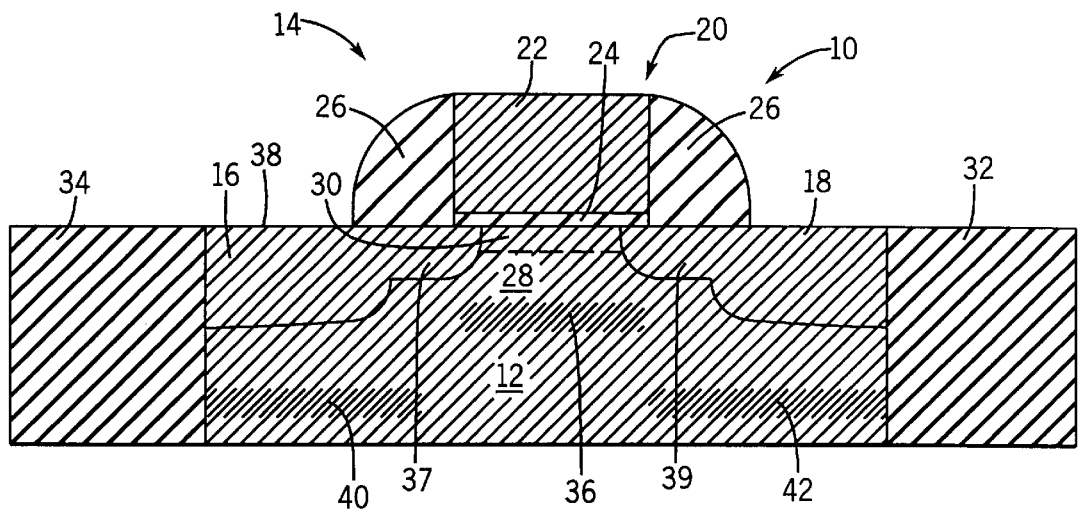
FIG. 1 is a cross-sectional view of a portion of a semiconductor substrate having punch-through suppression in accordance with an exemplary embodiment of the present invention.

Referring first to FIG. 1, FIG. 1 is a cross-sectional view of a portion 10 of a semiconductor substrate 12 having punch-through suppression in accordance with an exemplary embodiment of the present invention. Portion 10 includes a device 14 fabricated thereon. Device 14 may be a transistor, e.g. a metal oxide semiconductor field effect transistor (MOSFET) or other device requiring the suppression of punch-through current or requiring electrical isolation between two regions of the device. Device 14 may be fabricated according to any of a number of known fabrication techniques, e.g. a complementary metal oxide semiconductor (CMOS) process. Substrate 12 preferably comprises silicon, and may also comprise gallium arsenide or other semi-conductive materials.

In this presently preferred embodiment, device 14 is a MOSFET including a source doped region 16 and a drain doped region 18 of substrate 12. Doped regions 16 and 18 may be doped with a dopant material, e.g. boron, phosphorus, indium, arsenic, boron difluoride or other dopant to form P-type or N-type doped regions. Device 14 further includes a gate stack 20 having a conductive portion 22 made from a conductive material such as polysilicon. Gate stack 20 further includes an insulative portion 24 which, in this embodiment, may be an oxide layer or layer of other insulative material. Gate stack 22 also may include sidewall spacers 26 to isolate conductive portion 22 from neighboring fabrication layers of portion 10.

Device 14 further may include a well region 28 within which doped regions 16 and 18 are disposed, well region 28 typically being doped to fabricate a desired electrical property of well region 28. In this exemplary embodiment, well region 28 is a lightly doped region of substrate 12 and may extend, e.g. about 0.2 to 0.25 microns below a top surface 38 of substrate 12. Device 14 further includes a channel region 30 providing a region of electrical conductivity between doped regions 16 and 18. Channel region 30 may also be doped to improve the conductivity of the region to allow carriers to pass freely between doped regions 16 and 18 when device 14 is in the ON state. Portion 10 may also advantageously include shallow trench isolation structures 32 and 34 which provide electrical isolation between device 14 and neighboring devices (not shown).

According to one embodiment of the present invention, portion 10 further includes a first region 36 (indicated by the double cross-hatch pattern in FIG. 1) of semiconductor substrate 12 located in or near well region 28 and advantageously between source doped region 16 and drain doped region 18, first region 36 being comprised of an implant material implanted in substrate 12. Implant material may be any material that is not electrically activated by a subsequent thermal annealing process step, e.g. inert ions such as nitrogen, oxygen and xenon. First region 36 preferably contains an accumulation of inert ions, such as, nitrogen. First region 36 forms a semi-insulating layer in an area below top surface 38 of substrate 12, which, during operation of device 14, maintains the depletion layers of source doped region 16 and drain doped region 18 separated from each other. The separation of doped regions 16, 18 acts to suppress punch-through between regions 16, 18. Region 36 can be located below channel region 30 and partially below a source extension 37 and a drain extension 39.

According to an additional embodiment of the present invention, a second region 40 and a third region 42 (both regions 40 and 42 indicated by the double cross-hatch pattern of FIG. 1) of substrate 12 contain similar material implants to the material implants of first region 36. Second region 40 is advantageously located below source doped region 16 and third region 42 is advantageously located below drain doped region 18. Region 40 can also be partially located below source extension 37, and region 42 can also be partially located below drain extension 39. In the preferred embodiment, regions 40 and 42 are not directly below region 36. Second and third regions 40, 42 are located deeper than first region 36 in substrate 12. Second and third regions 40, 42 are effective in avoiding additional leakage of current through device 14, some of which leakage may result from defects generated by the inert ion implantation process described hereafter.

Figure 2:
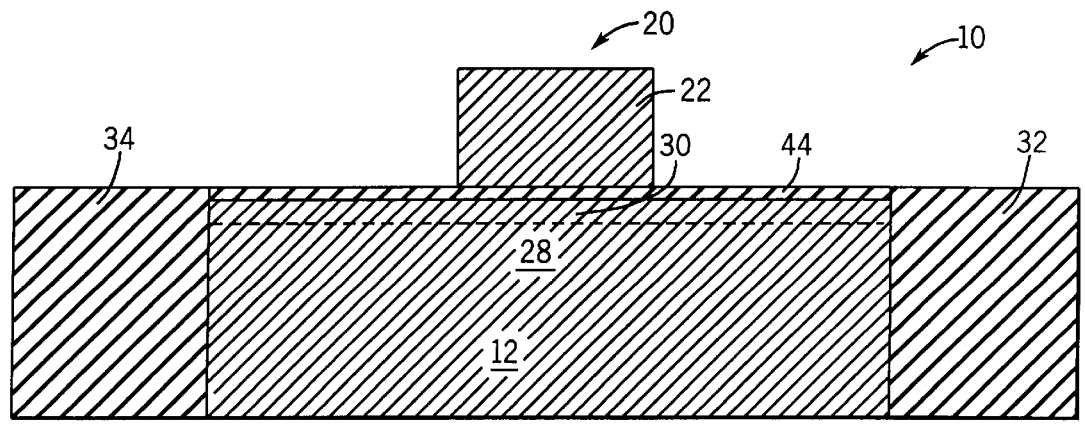
FIG. 2 is a cross-sectional view of the portion of the semiconductor substrate illustrated in FIG. 1 showing a gate forming step.
Figure 3:
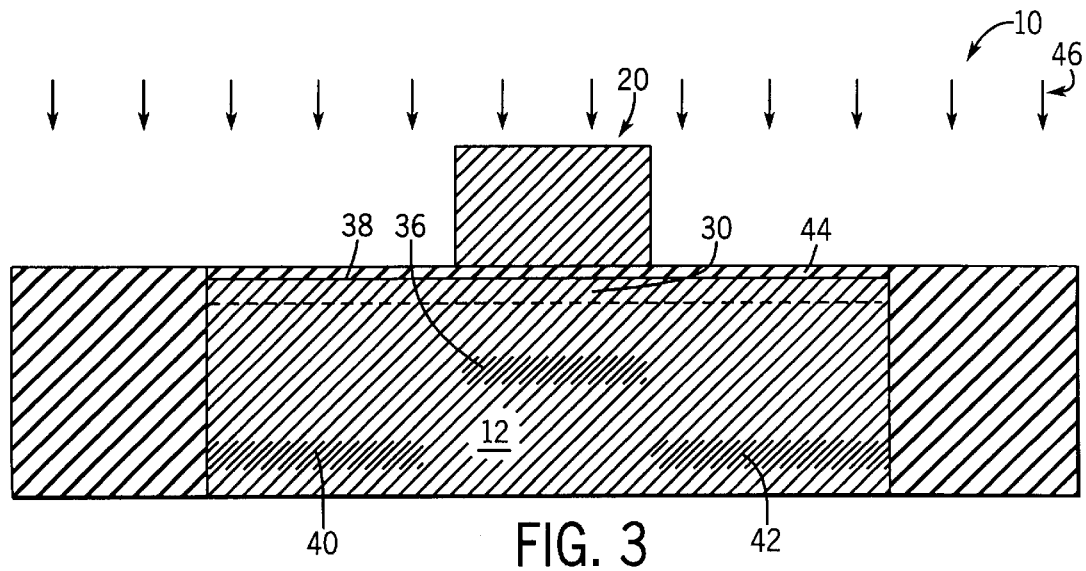
FIG. 3 is a cross-sectional view of the portion illustrated in FIG. 1 showing a material implanting step.

Referring now to FIG. 2 and FIG. 3, a method of fabricating portion 10 of substrate 12 according to a preferred embodiment of the present invention is described. Referring first to FIG. 2, FIG. 2 is a cross-sectional view of portion 10 of semiconductor substrate 12 showing a gate forming step. Isolation structures 32 and 34 are formed in substrate 12 according to shallow trench isolation (STI) methods well known in the art. Typically, isolation structures 32 and 34 contain an insulative material for providing electrical isolation between device 14 and neighboring devices (not shown) and can be manufactured according to any technique.

Device 14 can be fabricated according to conventional complementary metal oxide semiconductor (CMOS) processes, or other semiconductor fabrication processes. An insulative layer 44 is thermally grown over substrate 12 or applied over substrate 12 using a known deposition process, e.g. chemical vapor deposition (CVD), physical vapor deposition (PVD). Typically, substrate 12 is lightly doped to form well region 28, the dopants having the opposite type (P-type or N-type) of substrate 12. Channel region 30 may be any region of substrate 12 through which carriers or other charges are intended to travel. Channel region 30 may be fabricated by doping or implantation of a dopant material to achieve the desired characteristics of the region between subsequently implanted doped regions 16 and 18. Conductive portion 22 of gate stack 20 is preferably polysilicon or another conductive material and can be fabricated by a conventional deposition etching process. Gate stack 20 may subsequently be heavily doped with a dopant, e.g. boron.

Referring now to FIG. 3, FIG. 3 is a cross-sectional view of portion 10 illustrated in FIG. 1 showing a material implantation step. With gate stack 20 in place, the material implantation step according to the present invention may be performed. As indicated by arrows 46, an implant material is implanted through gate stack 20. The implant material may be any material which will not become electrically activated during a subsequent thermal annealing step due to the material having a large activation energy. In this presently preferred embodiment, the implant material may include inert ions, e.g. nitrogen, oxygen or xenon ions.

The implant material is implanted using a conventional implantation device, e.g. the Varian E220 device manufactured by Varian Corp. of Palo Alto, Calif., with a high dosage, i.e. $1 \times 10^{16}$ dopants per $cm^2$. Briefly, energetic, charged atoms or molecules are directly introduced into substrate 12 by an acceleration apparatus, such as, the Varian E220 device mentioned above, which accelerates the ions to between 10 and 100 kiloelectron Volts (keV). This implanted material forms a first region 36 of substrate 12 comprising a concentration of, e.g. nitrogen ions. First region 36 forms a semi-insulating layer in the subsurface region, which keeps the depletion layers of subsequently fabricated source and drain regions 16, 18 (see FIG. 1) from contacting each other, thereby suppressing punch-through. Additional benefits of the present invention can be obtained by implanting nitrogen ions as opposed to oxygen ions because implantation of oxygen ions may encourage undesirable oxygen-enhanced diffusion in substrate 12.

A further feature of the present invention relates to the effect that the material implantation step has on gate stack 20. As mentioned previously, gate stack 20 may be doped with boron. The boron dopant, however, tends to diffuse through insulative portion 24 during subsequent thermal annealing. To counter this effect, it was discovered that the material implantation step of the present invention leaves a reasonable amount of material, e.g. nitrogen ions, near top surface 38 of substrate 12. This amount of material, while not interfering substantially with the electrical properties of channel region 30, suppresses the gate boron diffusion through insulative portion 24. Accordingly, process variation can be reduced.

Yet another feature of the present invention relates to the effect that the material implantation step has on a common phenomena called transient-enhanced diffusion (TED). During the numerous doping steps of fabricating a device such as device 14, e.g. source and drain region doping, well/tub region doping and Vt-adjust implantation, defects are introduced into substrate 12. These defects are the result of vacancies in the silicon left from the numerous doping steps. It was found that the implantation step of the present invention actually "fills in" these vacancies, virtually neutralizing TED. This neutralizing effect is particularly effective with the use of nitrogen ion implant material.

According to another advantageous embodiment of the present invention, the material implantation as indicated by arrows 46 further includes implantation below the subsequently fabricated source and drain regions 16, 18 (see FIG. 1) to form second region 40 and third region 42 in substrate 12. Regions 40 and 42 are additional material accumulation regions beneath subsequently fabricated drain and source regions 16 and 18. Preferably, regions 40 and 42 extend to a deeper point in substrate 12 than does region 36. The implant material pile-up of first region 36 under channel 30 is good for suppressing punch-through, while the deeper implant material pile-up regions 40, 42 are operative to avoid additional junction leakage. This material implantation, as shown in FIG. 3, is done according to similar methods discussed above with reference to fabricating accumulation region 36. As shown in FIG. 3, as the material is introduced to substrate 12, the speed of the material ions are reduced by the amount of substrate and/or gate material that the ions must travel through. Accordingly, because the material forming first region 36 must travel through gate stack 20, the material comes to rest at a region closer to surface 38 than does the material of second region 40 and third region 42.

Referring again to FIG. 1, additional steps in the fabrication process of the present invention are shown. Doped regions 16 and 18 may be formed by standard chemical doping methods, e.g. implantation or chemical diffusion of boron, phosphorous, etc. Additionally, insulative layer 44 (FIG. 3) may be etched to remove portions that are not beneath gate stack 20, leaving insulative portion 24 remaining. Side wall spacers 26 may be fabricated according to methods well known in the art. Also, a conventional thermal annealing step will activate certain dopants on substrate 12 while leaving regions 36, 40 and 42 unactivated.

Figure 4:
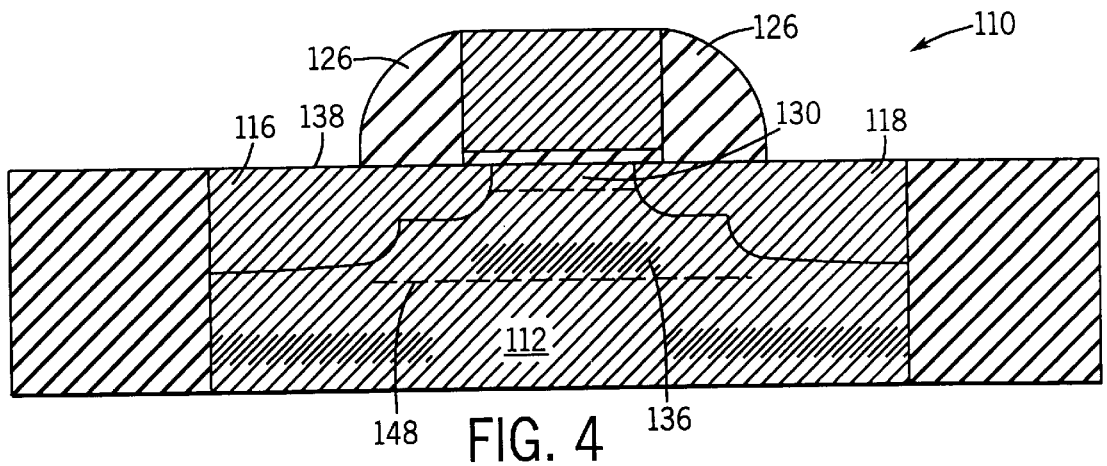
FIG. 4 is a cross-sectional view of a portion of a semiconductor substrate having punch-through suppression in accordance with an alternative exemplary embodiment of the present invention.
Figure 5:
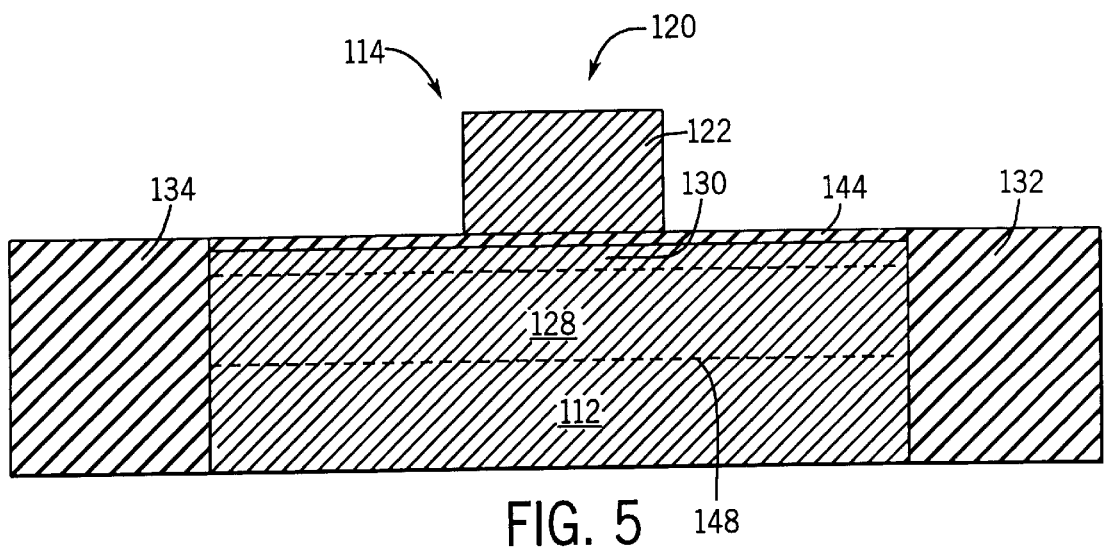
FIG. 5 is a cross-sectional view of the portion of the semiconductor substrate illustrated in FIG. 4 showing a gate forming step and a dopant implanting step.
Figure 6:
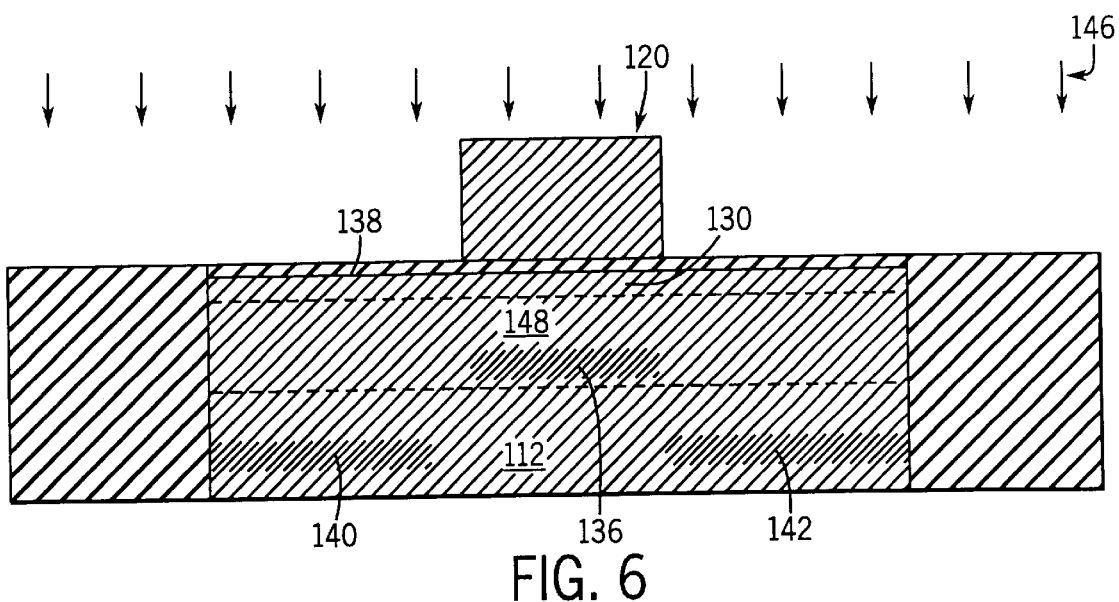
FIG. 6 is a cross-sectional view of the portion of FIG. 4 showing a material implant step.

Referring now to FIGS. 4–6, these figures show an alternative embodiment of the present invention. FIG. 4 is a cross-sectional view of a portion 110 of a semiconductor substrate 112 having punch-through suppression in accordance with an alternative exemplary embodiment of the present invention. In this embodiment, a punch-through implant is located in an implant region 148 of substrate 112. Implant region 148 is a region of increased doping, e.g. boron in N-channel MOSFETs, implanted beneath a channel region 130 to raise the doping beneath channel region 130 above the doping of substrate 112. As discussed hereinabove, implant region 148 serves to suppress punch-through between a source doped region 116 and a drain doped region 118. However, because implant region 148 may diffuse toward a surface 138 of substrate 112 during subsequent thermal annealing, the present invention provides a novel means of retaining implant region 148 in its desired location on substrate 112. This means is first region 136 of material implant.

First region 136 of material implant, e.g. nitrogen, oxygen or xenon, acts as a diffusion barrier to the dopant from the punch-through implant in implant region 148. Thus, the dopant concentration near surface 138 is low to promote mobility of carriers between source doped region 116 and drain doped region 118, and the dopant concentration below channel region 130 is high to promote good punch-through suppression. Thus, a steep retrograded dopant profile in channel region 130 may be maintained in the vertical direction.

With respect to FIG. 5 and FIG. 6, a method of fabricating an integrated circuit according to this second exemplary embodiment is described. It will be recognized by one skilled in the art that many of the fabrication steps in this second exemplary embodiment may be similar to those of the first embodiment. Referring to FIG. 5, FIG. 5 is a cross-sectional view of portion 110 of semiconductor substrate 112 showing a gate forming step and a dopant implanting step. Shallow trench isolation structures 132 and 134 may be fabricated in substrate 112 to isolate device 114 from neighboring devices according to conventional isolation methods. A well region 128 may be fabricated in substrate 112 according to a standard chemical doping process or an implantation dopant process to form a lightly doped region of substrate 112 having an opposite type (P-type or N-type) as the type of substrate 112. A channel region 130 may also be fabricated in FIG. 5 using a chemical doping process or implantation process to promote carrier mobility between subsequently fabricated doped regions 116 and 118.

An insulative layer 144 may be fabricated over substrate 112. Additionally, a gate stack 120 comprising a conductive material 122, e.g. polysilicon, may be etched or deposited on substrate 112 above layer 144.

A punch-through stopper or implant may be deposited either before or after the formation of gate stack 120 to form implant region 148. Implant region 148 advantageously extends from a point below channel region 130 into substrate 112, and is comprised of a region of dopant material designed to suppress punch-through between regions 116 and 118. In prior art methods, during a subsequent thermal annealing step, dopant from implant region 148 would diffuse upward into channel region 130, altering the electrical characteristics of channel region 130. To overcome this undesirable circumstance a material implantation step according to the present invention is illustrated with reference to FIG. 6.

As indicated by arrows 146, an implant material similar to the implant material defined above is implanted into substrate 112 using an implantation process as described above with reference to FIG. 3. During implantation, an implant material, e.g. including inert ions such as nitrogen, is implanted into substrate 112 and through gate stack 120 to form at least a first region 136 of inert ion accumulation. First region 136 operates to prevent the upward diffusion of dopants from implant region 148 into channel region 130. Consequently, first region 136 maintains the doping concentration near surface 138, i.e. near channel region 130 low to maintain good channel mobility, while the doping concentration of implant region 148 remains high in the area below channel region 130 to maintain good punch-through suppression.

Advantageously, and according to another feature of the present invention, second region 140 and third region 142 of inert ion accumulation may be implanted in substrate 112 to reduce additional junction leakage between doped regions 116 and 118. Subsequent steps may include, as indicated in FIG. 4, source doped region 16 and drain doped region 18 doping steps, and the addition of sidewall spacers 126. Also, portion 110 may be thermally annealed to activate the dopants. The dopant concentration of the exemplary embodiment in FIGS. 4–6 is preferably a medium dose of dopants, e.g. $1 \times 10^{15}$ dopants per $cm^2$. The embodiment of FIGS. 4–6 includes most of the same benefits, features and advantages of the embodiment of FIGS. 1–3, those advantages being either recited herein or understood by one skilled in the art.

It is understood that, while detailed drawings and specific examples given describe preferred exemplary embodiments of the present invention, they are for the purpose of illustration only. The present invention is not limited to the precise details, methods, materials, and conditions disclosed. For example, the specific dopant concentrations of first regions 36 and 136 may vary by an order of magnitude or more from those disclosed herein, depending upon the particular application of the present invention. Additionally, the present invention is not limited to applications in MOSFETs or even transistors, but may find applications in other semiconductor device structures. The various layers, contacts, cells, and transistors may have different geometry depending on integrated circuit designs and process technologies. Accordingly, the present invention is not to be limited to any specific embodiment herein, but rather is to extend to all embodiments now known or later developed that fall within the spirit and scope of the present invention as defined by the claims appended hereinafter.

What is claimed is:

1. A method of fabricating an integrated circuit having punch-through suppression between two regions of a device, the device including a channel region between the two regions, the method comprising the steps of:
   providing a semiconductor substrate;
   implanting a punch-through dopant at least between the two regions of the device to form a punch-through dopant;
   forming a gate on the substrate over the channel region; and
   implanting inert ions through the gate wherein the inert ions accumulate below the channel region, wherein the punch-through dopant is below the inert ions;
   whereby the accumulation of inert ions suppresses punch-through between the two regions of the device and further suppresses diffusion of the punch-through dopant implant upward into the channel region.

2. The method of claim 1, wherein the inert ions are implanted through the gate and through the two regions of the device wherein the inert ions form second and third accumulations below the surface of the two regions of the device.

3. The method of claim 2, further comprising:
   doping the two regions with dopant to form a source region and a drain region, wherein the bottom of the two regions are separated from the second and third accumulations.

4. The method of claim 3, further comprising: thermally annealing the device to electrically activate the dopants wherein the inert ions are not electrically activated by the thermally annealing step.

5. The method of claim 4, further comprising: applying an insulative layer between the gate and the substrate.

6. The method of claim 2, wherein the second and third accumulations of inert ions are deeper than the first accumulation of inert ions.

7. The method of claim 1, wherein the inert ions are implanted with a dosage of approximately $1 \times 10^{16}$ dopants $cm^{-2}$.

8. The method of claim 1, wherein the inert ions include nitrogen.

9. The method of claim 8, wherein the substrate has a level of transient enhanced diffusion and further wherein the nitrogen inert ions substantially neutralize the transient enhanced diffusion.

10. The method of claim 1, further comprising: doping the gate with a dopant, wherein diffusion of the dopant into the channel region is suppressed by the inert ions.

11. A method of fabricating an integrated circuit having punch-through suppression between two regions of a device, the device including a channel region between the two regions, the method comprising the steps of:
   providing a semiconductor substrate;
   implanting a punch-through dopant at least between the two regions of the device to form a punch-through dopant implant;
   forming a gate on the substrate over the channel region; and
   implanting an implant material through the gate wherein the implant material accumulates below the channel region, wherein at least a portion of the punch-through dopant is below the implant material;
   whereby the accumulation of implant material suppresses punch-through between the two regions of the device and further suppresses diffusion of the punch-through dopant implant upward into the channel region.

12. The method of claim 11, wherein the punch-through dopant forms a first region of low dopant concentration near the channel region and a second region of high dopant concentration below the channel region.

13. The method of claim 12, wherein the implant material includes inert ions and is implanted through the gate and through the two regions of the device, wherein the inert ions form second and third accumulations below the surface of the two regions of the device, wherein the second and third accumulations of inert ions are deeper than the first accumulation of inert ions.

14. The method of claim 11, further comprising: applying an insulative layer between the gate and the substrate.

15. The method of claim 13, wherein the second and third accumulations are separated from the two regions.

16. The method of claim 11, wherein the substrate has a level of transient enhanced diffusion and further wherein the implant material includes nitrogen inert ions, the nitrogen inert ions substantially neutralizing the transient enhanced diffusion.

17. A method of fabricating an integrated circuit having electrical isolation between two regions of the integrated circuit, the method comprising the steps of:

providing a semiconductor substrate;

implanting a punch-through dopant between the two regions of the device to form a punch-through dopant implant;

forming a conductive structure on the substrate; and implanting inert ions through the conductive structure and through the two regions of the device wherein the inert ions form a first accumulation at least a portion of which is below the conductive structure and extending at least the width of the conductive structure and second and third accumulations below the two regions of the device wherein at least a portion of the punch-through dopant is below the first accumulation;

whereby the accumulations of inert ions provide electrical isolation of the two regions of the device.

18. The method of claim 17, wherein the second and third accumulations of inert ions are deeper than the first accumulation of inert ions and separated from the two regions.

19. The method of claim 18, wherein the inert ions include nitrogen.

20. The method of claim 19, wherein the conductive structure is the gate of a MOSFET.

* * * * *